United States Patent [19]

Isaacs et al.

[11] Patent Number: 5,275,330
[45] Date of Patent: Jan. 4, 1994

[54] SOLDER BALL CONNECT PAD-ON-VIA ASSEMBLY PROCESS

[75] Inventors: Phillip D. Isaacs; Gregg A. Knotts, both of Rochester; Miles F. Swain, Hayfield; Burton A. Towne, Austin, all of Minn.

[73] Assignee: International Business Machines Corp., Armonk, N.Y.

[21] Appl. No.: 46,052

[22] Filed: Apr. 12, 1993

[51] Int. Cl.$^5$ .............................................. H05K 3/34
[52] U.S. Cl. .............................. 228/180.2; 228/248.1
[58] Field of Search ...................... 228/180.2, 248, 254, 228/224, 245

[56] References Cited

U.S. PATENT DOCUMENTS

| | | | |
|---|---|---|---|
| 4,336,551 | 6/1982 | Fujita et al. | 357/80 |
| 4,383,363 | 5/1983 | Hayakawa et al. | 29/847 |
| 4,830,264 | 5/1989 | Bataillou et al. | 228/180.2 |
| 4,889,275 | 12/1989 | Mullen et al. | 228/248 |
| 5,060,844 | 10/1991 | Behun et al. | 228/180.2 |

OTHER PUBLICATIONS

IBM Technical Disclosure Bulletin, vol. 20, No. 10, p. 3872, Mar. 1978 Pinless Module Connector, E. Stephans.

IBM Technical Disclosure Bulletin, vol. 33, No. 12 pp. 144–145, May 1991, Via Fill With Molten Solder.

*Primary Examiner*—Samuel M. Heinrich
*Attorney, Agent, or Firm*—Laurence R. Letson

[57] ABSTRACT

A technique for filling hollow, plated-through-hole vias in multi-layer printed circuit substrates with solder and then joining the solder filled via with a solder ball on a solder ball connectable electronic module is disclosed. The filling of the vias is accomplished by depositing solder paste on one end of the hollow via and reflowing the solder particles within the solder paste to at least partially fill the PTH via. The depositing of the solder paste and the reflowing operations may be repeated until such time as the via is substantially completely filled with solid solder. The importance of the prefilling of the vias with solder is that the reflowing operation of solder balls or solder paste when joining the multi-layer printed circuit board to the electronic module, will prevent undue wicking or pulling of molten solder from the electrical connection into the PTH via, thereby preventing the formation of solder starved or unreliable electrical connections.

11 Claims, 4 Drawing Sheets

SOLDER BALL CONNECT PAD-ON-VIA ASSEMBLY PROCESS

FIELD OF THE INVENTION

This invention relates to electrically connecting solder balls of an electronic module to a plated through hole via in a substrate such as a printed circuit card.

BACKGROUND OF THE INVENTION

In the fabrication of printed circuit cards, via holes are formed to create passages from one face or surface of the card to the opposing face or surface of the card. In passing through the card, electrically conductive lands formed within the card during the manufacture of the card, may be penetrated or cut into thus exposing a cross-section of the land to the via hole. The land may be disposed internal to the printed circuit as on a surface of a layer, which is subsequently joined with other layers to form the card or onto the external surface of the printed circuit card.

The via holes are plated, using any of several conventional plating techniques, to deposit a thin layer of metal on the interior surface of the passage or via hole. The metal layer within the via hole is in the form of a tube formed or deposited on and making contact with the cross-section of any land penetrated by the formation of the via. The formation of printed circuit cards of the type used herein is a conventional process well known in the electronics industry and as such does not form a part of this invention.

During the plating of the via hole, a flange surrounding the end or opening of the via may be formed on at least one surface of the printed circuit card. The plating of the flange may occur simultaneously to the plating of the interior tubular plated layer within the via hole.

The flange forms a pad that serves to increase the surface area, which may be wetted with solder at a later stage, in order to connect electrical components to the metal deposited by the plating. The formation of the pad alternatively may be formed as a separate plating operation or metal deposition operation together with the formation of any land extending therefrom formed on the surface of the printed circuit board.

Plated through via holes previously have been filled to enhance solder connection to the plating. U.S. Pat. No. 4,830,264, issued to Bitaillou et al., discloses filling the hollow rivet-like structure of the via hole plating with a solder flux. The solder flux filling enhances the wetting of the plated structure by the solder when heated for reflow. Then a larger than necessary solder ball of controlled volume is deposited onto the solder flux which has been filled into the via hole; a portion of the flux resides on the surface of the electronic circuit board in the region of the via hole and on the pad surrounding it.

The solder ball is larger than that which would be necessary only to fill the via hole so that when the solder ball is reflowed the via hole will fill through capillary action and leave a solder ball on the surface of the printed circuit board sufficiently large and of the desired volume that it may be used to attach another electrical component to the circuit board.

The solder ball formed on the surface of the printed circuit card may be used to connect another electronic component to the printed circuit card by any conventional technique. The Bitaillou et al. patent illustrates the affect that is a source of the problem if the via is not adequately filled with solder prior to attachment of a solder ball connected electronic module. Should there be an attempt to connect an electronic module to the printed circuit board using solder ball connection techniques and the plated through via holes have not been filled previously with solder, then whenever the solder connection between the electronic module and the printed circuit card is reflowed, the via hole will pull molten solder into the via hole thus significantly reducing the volume of solder available for the interconnection between the electronic module and the printed circuit card. Unless the volumes of the via hole and the volume of solder in the solder ball are very accurately controlled, variations in the volume of the remaining solder ball after reflow may be the source of unreliable electrical connections between the two electronic components.

U.S. Pat. No. 4,336,551 to Fujita et al., discloses forming a via hole through a glass insulation layer and then forming a pedestal for attaching solder balls on an integrated circuit. The pedestal is formed of a silver/palladium paste. Subsequent to the formation of the silver/palladium (Ag/Pd) paste pedestal, the silver/palladium paste particles are sintered to form rigid integrity into the contact pedestal and establish electrical continuity. In the attachment of solder balls onto an integrated circuit to the sintered Ag/Pd pedestal, the pedestal serves as a contact region and does not reflow.

U.S. Pat. No. 4,383,363, issued to Hayakawa et al., uses a solder paste to interconnect the conductive planes on either face of a printed circuit board through a via hole. The via hole is not plated and the solder paste is not reflowed. Conductive layers deposited on the substrate and over the via entrap the solder paste within the via hole. Electrical continuity is established through particle-to-particle contact.

U.S. Pat. No. 5,060,844, issued to Behun et al., discloses a solder ball connect technique where the internal metallurgy of the substrate or device being connected to the substrate, is solid conductor lands and is not via holes. The Behun et al. patent addresses the solder ball connection of electronic components, wherein the connections on each of the components are to a solid electronic land.

With solid lands, the Behun et al. structure does not present the problem presented by plated through hole vias. The Behun et al. patent with its inherently solid electrically conductive lands does not wick or pull the molten solder from the attachment point into a cavity of the via hole within the printed circuit card.

IBM Technical Disclosure Bulletin, Vol. 20, No. 10, March 1978, page 3872, by E. Stephens, discloses a conductive epoxy which is used to fill via holes and which establishes electrical continuity between the external surfaces of the metallized ceramic body through which the via holes extend. IBM Technical Disclosure Bulletin, Vol. 33, No. 12, May 1991, pages 144–145, discloses a machine for positioning and melting solder wire to fill via holes on a one-at-a-time basis. This process while providing a solution to the problem of prefilling via holes with solder is not a process which lends itself to high volume throughput necessary for manufacturing.

OBJECTS OF THE INVENTION

It is an object of the invention to form a solid filling of solder in plated-through-hole vias to establish reliable electrical continuity.

It is another object of the invention to utilize reflowed solder to fill via holes in a substrate.

It is a further object of the invention to connect electronic modules with a substrate via hole pad by filling the via hole with a solder plug formed of reflowed solder paste.

The objects of the invention are accomplished and the shortcomings of the prior art overcome by the subject invention. A summary understanding of the invention may be had from the following summary of the invention.

SUMMARY OF THE INVENTION

In order to attach solder balls of a solder ball connect component such as an electronic module to a printed circuit board which is preferably a multi-layer printed circuit board, the multi-layer printed circuit board (MLPCB) must have attachment points. Typically, such attachment points are the ends of the via holes which extend through the substrate to which the electronic module is to be connected. The via holes are plated on the interior to establish electrical continuity with conductors within the substrate and resident on any surface lands which may have been formed on the exposed surfaces of the substrate. The via holes are very small in diameter and form a hollow passage through the MLPCB substrate. By the nature of the small hollow tubular opening, the plated through holes (PTH) lend themselves to solder filling causing the PTH to wick or pull liquid solder into the PTH via by capillary action and the surface tension of the molten solder.

Solder paste, comprising a mixture of small solder particles and flux paste is screened onto locations at the ends of a PTH via. The PTH via is provided with a flange surrounding at least one end thereof and supported by the MLPCB. The flange is a continuation of the plating in the PTH via or of a separate land in electrical contact with the PTH conductive tube.

The flange surrounding the opening of the PTH may be of any desired shape such as circular, square, rectangular or polygonal. The shape will be dictated by the available area and the need for precision in locating the pad relative to the via and the solder balls on the electronic component.

The solder paste is deposited onto the pad, preferably by screening, since screening provides precision location with respect to the MLPCB substrate. The printed circuit board substrate and the solder paste then are heated in a conventional manner to melt the flux and the solder particles reflowing the solder. Surface tension of the molten solder causes the particles to form one mass and the capillary action between the solder and PTH pulls or wicks the solder mass into the PTH via, at least partially filling the via. This screening of solder paste and heating to reflow the solder is repeated as necessary to substantially fill the PTH via.

Thereafter, an additional quantity of solder paste is deposited on the pad. An electronic module may be provided with pre-solder connected solder balls or stubby pins for connecting the electronic module to the MLPCB substrate. The solder balls or stubby pins are aligned with the solder paste deposits and pushed into the solder paste deposit to firmly contact the solder ball or the stubby pins with the solder paste. The resulting assembly then is heated to reflow the solder paste and fuse the solder in the PTH via with the solder ball. The solder particles in the solder paste deposit will melt, and wet the solder ball and resolidify, forming a homogenous bond with the solder already resident within the PTH via.

Cleaning steps may be performed at any time during the process wherein it is necessary to remove flux residue or other manufacturing contaminants. Alternate embodiments include to position the solder balls on the paste and then to position the electronic module with similar paste deposits on the solder balls and to reflow the solder paste thereby simultaneously fusing the solder ball to both the electronic module and the PTH via.

A more detailed understanding of the invention may be had from the drawings and the detailed description of the invention to follow.

DRAWINGS

DETAILED DESCRIPTION OF THE PREFERRED EMBODIMENT OF THE BEST MODE OF THE INVENTION AS CONTEMPLATED BY THE INVENTORS

Figure 1:
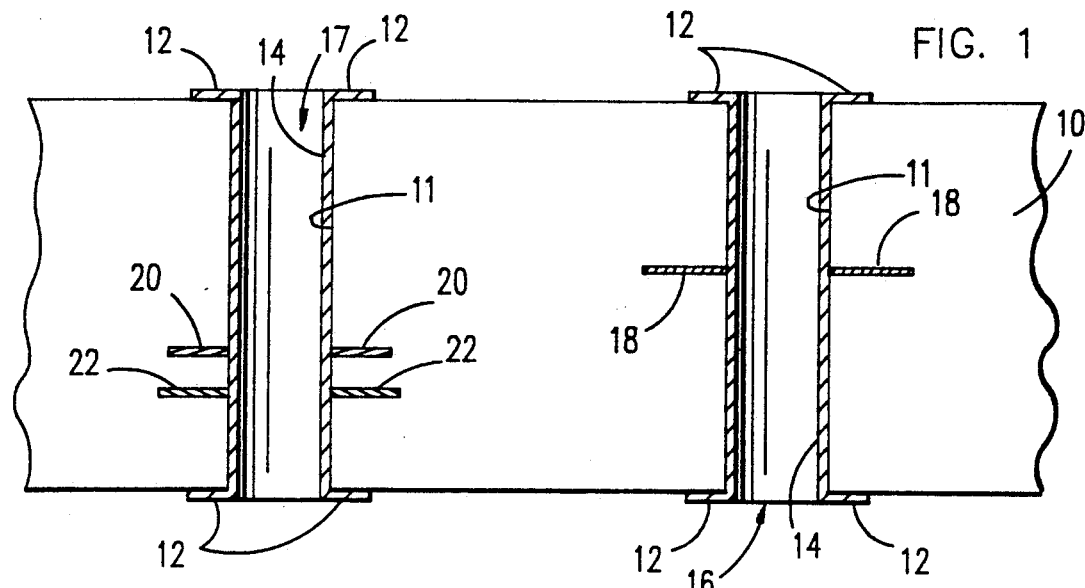
FIG. 1 illustrates a sectioned view of a multi-layer printed circuit board having a plated through via hole and a plurality of lands formed within the structure of the multi-layer printed circuit board.

Referring now to FIG. 1, a multi-layer printed circuit board (MLPCB) substrate 10, which may be an epoxy board, polyamide board, a flexible printed circuit board or a ceramic printed circuit, is illustrated as having a plurality of via holes 11. Via holes 11 and substrate 10 have been plated by a conventional plating technique to produce a flange 12 on each of the surfaces of MLPCB substrate 10. In additional, the plating has produced a tubular form of metal on the interior surface of the via hole 11 and is illustrated as a layer 14.

Contained within MLPCB substrate 10 is an electrically conductive land 18. This land is formed on the surface of a single printed circuit layer and is now incorporated into the multi-layer structure of the MLPCB substrate 10. Land 18, for the purposes of this disclosure, will be considered to be a power conductor. Land 18 is in physical and electrical contact with plated layer 14 of the interior of via 11. Accordingly, any power conducted on land 18 likewise will be conducted on layer 14 and flange 12 of the plated through hole via 16.

Referring now to PTH via 17, the plated layer 14 formed within PTH via 17 is similarly electrically connected to lands 20 and 22. Lands 20, 22 are layers of metal contained within MLPCB substrate 10 and pierced when via hole 11 is initially formed.

In an analogous manner, any data signal or other type of signal impressed upon the PTH via 17 likewise will be present on lands 20 and 22 for conduction to another part of the MLPCB substrate 10 and for use by another electrical circuit or circuit element.

Figure 2:
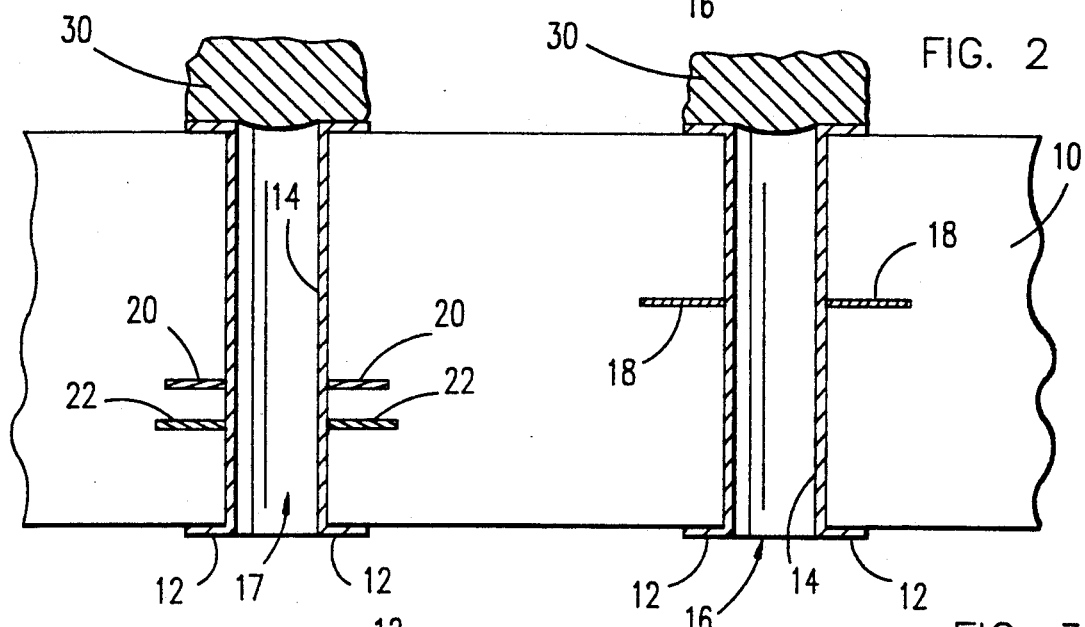
FIG. 2 illustrates, in a sectioned view, the MLPCB substrate of FIG. 1 with a deposit of solder paste on one end of each of the via holes.

Referring now to FIG. 2, and with the understanding that the reference numerals for items in FIG. 2 and subsequent figures which are the same as that as in FIG. 1, correspond to the same elements as shown in FIG. 1 and with the further understanding that no further substantial description of those items will be made, it is noted that masses of solder paste have been dispensed into a solder paste pad which are positioned above the PTH vias 16, 17 and are overlying flanges 12 which form and thus may be also further referred to as solder pad 12. To deposit the solder paste deposits 30 is preferably accomplished by a screening process because the screening accurately can position the solder paste deposits 30 while at the same time controlling the volume of solder paste dispensed. The volume of the solder paste deposit 30 may be controlled so that the solder content of solder paste deposit 30 either will partially or completely fill the PTH vias 16 and 17 upon reflow.

Figure 3:
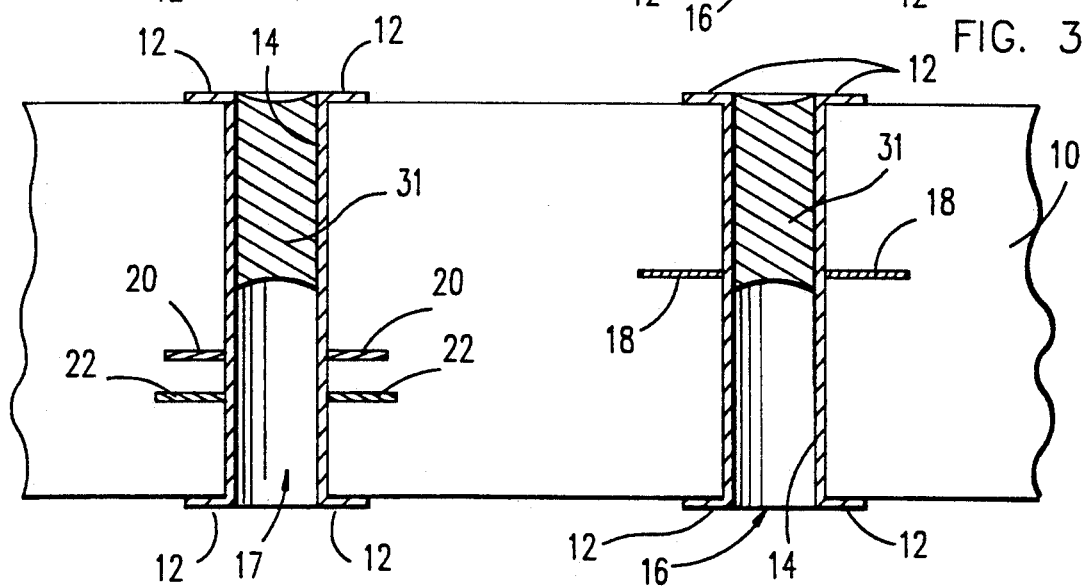
FIG. 3 shows, in a section view, the substrate of FIG. 1 after the deposit of solder paste has been reflowed and the solder pulled into the PTH via, partially filling the PTH via hole.

FIG. 3 illustrates the MLPCB substrate 10 from any of the previous figures after the MLPCB substrate 10 and the solder paste deposits 30 have been heated sufficiently to melt the flux contained within the solder paste deposit 30 and to melt the solder particles of the solder paste deposit 30. The wetting of the PTH vias 16, 17 with the molten solder draws the solder into the PTH vias 16, 17 and partially fill the PTH vias 16, 17 with solidified solder 31 upon appropriate cooling.

Figure 4:
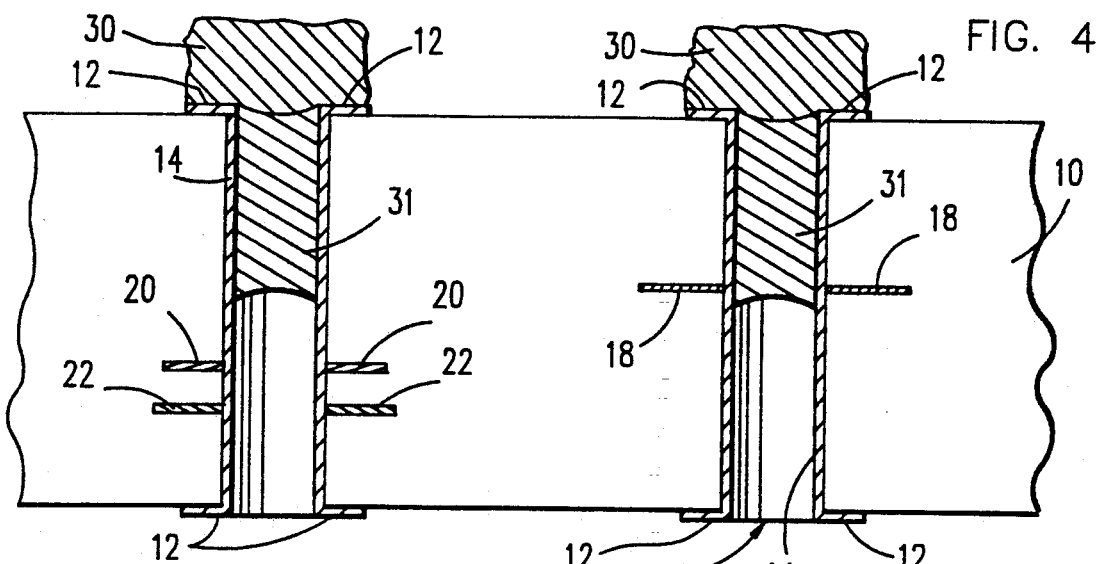
FIG. 4 illustrates the structure of FIG. 3 with solder paste deposits positioned above the partially filled via holes.

If the volume of solder in the solder paste deposit 30 is insufficient to fill the PTH vias 16, 17 with a single application and heating of the solder paste and substrate 10, the process steps of depositing and heating are repeated as illustrated in FIG. 4 whereby another quantity of solder paste has been deposited in solder paste deposit 30 overlying flanges 12 and the upper end of PTH vias 16 and 17. Upon further reflow of the solder paste deposits 30 in FIG. 4, the solder contained therein in particle form will be melted and will reflow to form solder deposits 31' along with any previously resident solder deposit 31 within PTH vias 16 and 17.

Figure 5:
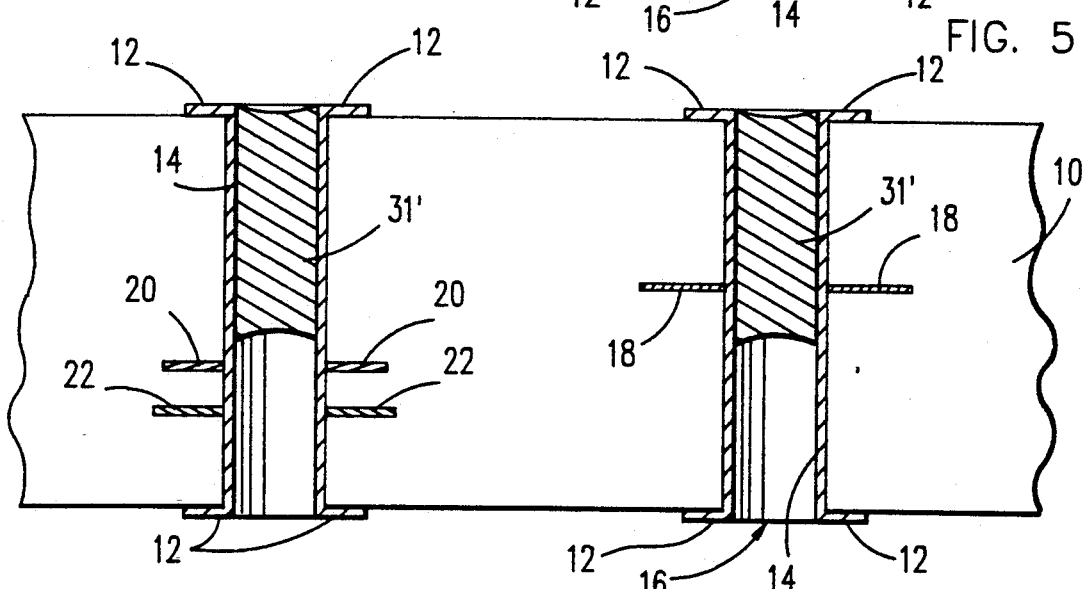
FIG. 5 illustrates the MLPCB substrate of FIG. 4 with the solder paste deposit reflowed.
Figure 6:
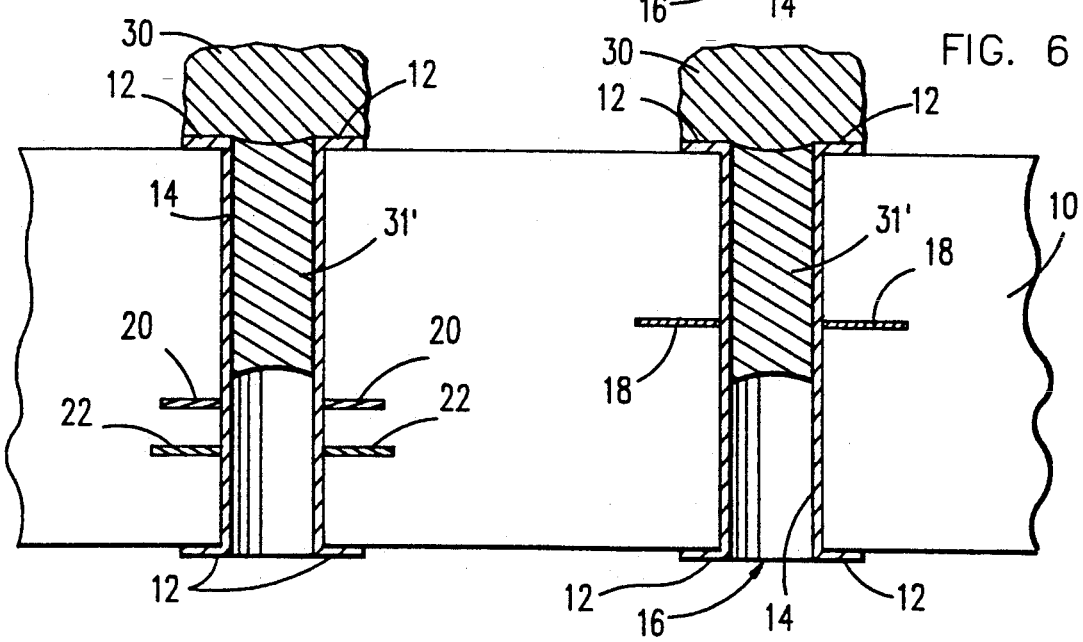
FIG. 6 shows the substrate of FIG. 5 with solder paste deposits positioned above the via holes.

Referring to FIG. 6, the MLPCB substrate 10 as illustrated in FIG. 5 again is the recipient of solder paste deposits 30 positioned as previously described.

Figure 7:
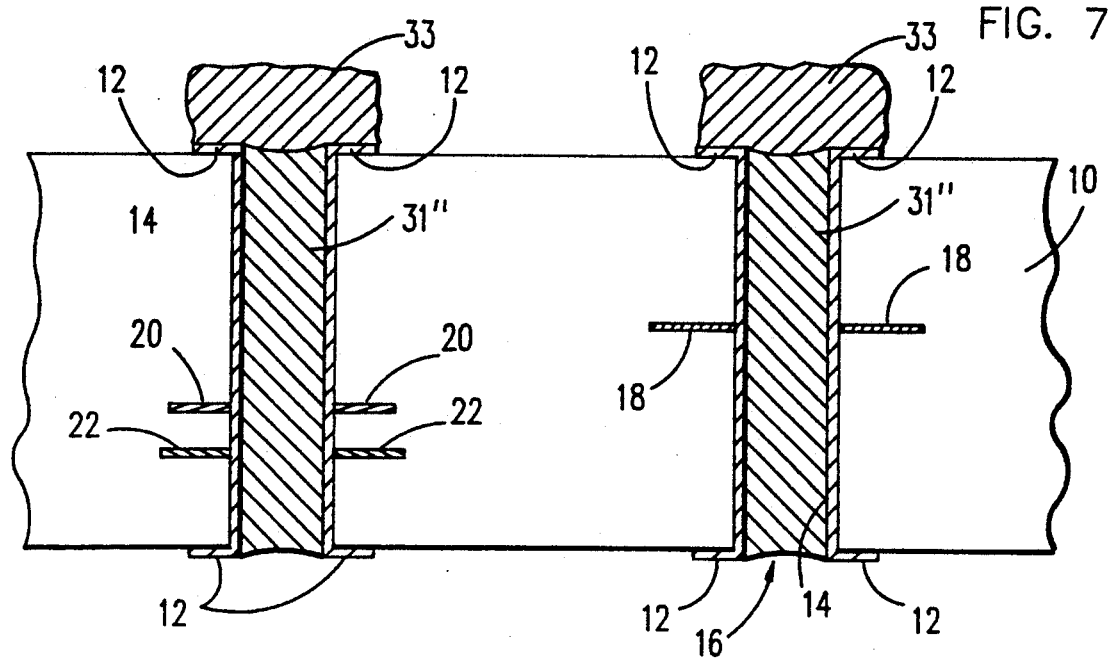
FIG. 7 illustrates the substrate of FIG. 6 after solder paste reflow and after the depositing of additional solder paste on the via holes.
Figure 8:
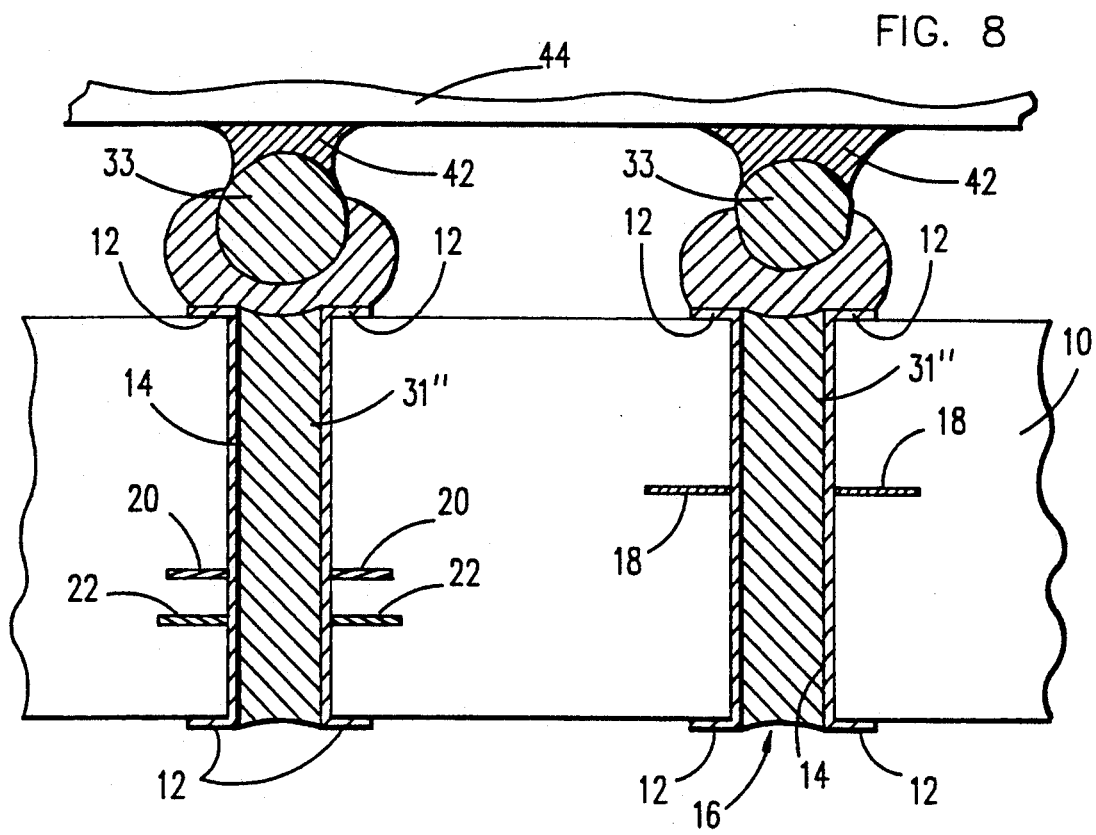
FIG. 8 illustrates the substrate, as illustrated in FIG. 7, with a solder ball connect device positioned with the solder balls engaged with the solder paste deposits.
Figure 9:
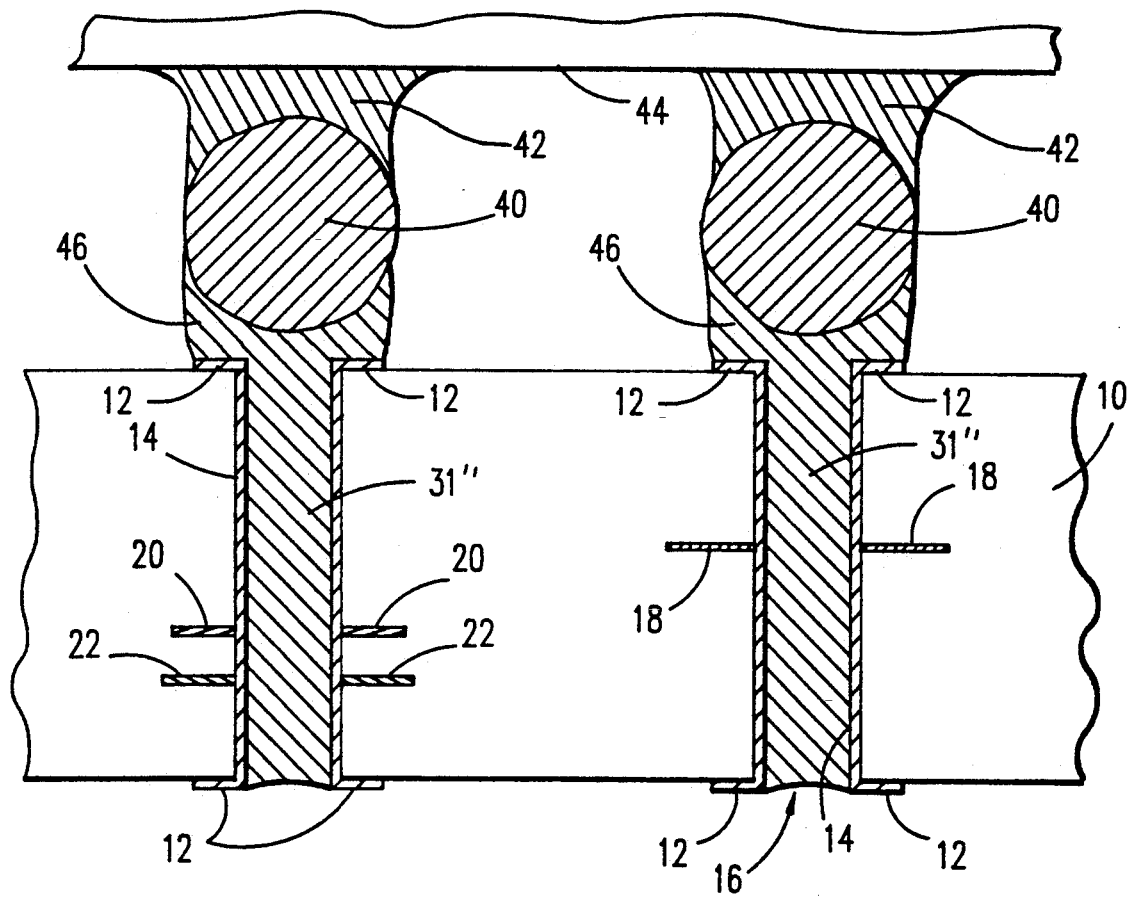
FIG. 9 illustrates the structure in FIG. 8 after the solder paste deposits have been reflowed.

Upon reflow of the solder paste deposit 30 in FIG. 6, the PTH vias 16, 17 will be substantially filled with solder 31" as in FIG. 7. FIG. 7 illustrates this condition and the depositing of solder paste deposits 33 positioned at the end of PTH vias 16 and 17 and their respective solder filled cores 31". Deposits 33 are positioned and deposited on the ends of the vias 16, 17 in preparation for receiving solder balls 40, best illustrated in FIG. 8. Solder balls 40 may have been previously attached to the electronic module 44 by means of reflowed solder 42. Solder 42 may be selected to have a melting point temperature equal to or higher than the melting point temperature of the solder in solder paste deposits 33 and solder 35". Solder balls 40 are fabricated of a very high melting point solder (VHMP) so that when solder 42 is reflowed, solder ball 40 will not be liquified, however, solder ball 40 may be of a solder with a melting point temperature equal to or higher than the melting point temperature of solder paste deposits 33 and solder 31".

Balls 40 could be fabricated of other metals that are solder wettable, such as copper, Invar, Kovar or other alloys. The balls could be of other shapes if desired.

Electronic module 44 is provided with the solder connected solder balls 40 depending therefrom; the electronic module 44 is positioned so that solder balls 40 align with the solder paste deposits 33 on PTH vias 16, 17. Solder balls 40 are physically forced into the solder paste deposits 33 to insure engagement between the solder paste deposit 33 and solder balls 40. The sticky or tacky nature of the solder flux in solder paste deposit 33 will adhere the solder balls 40 to the solder 31" contained within PTH vias 16, 17 and thereby to hold and retain electronic module 44 in its assembled relation to MLPCB 10. The electronic module 44 is not rigidly attached at this point in the process.

This assembly, of the MLPCB 10 and electronic module 44, then is heated to reflow the solder paste 33 and the solder 31 contained within the PTH vias 16, 17. Upon the reflow of solder paste 33, the mass of solder particles contained within the solder paste deposit 33 joins the solder 31" within the PTH vias and forms a homogenous mass of solder 31". The mass of solder 31" wets the solder ball 40 and fuses thereto without melting solder ball 40 or reflowed solder 42; this occurs because the melting point of solder 31" and solder paste 33 is selected, through solder alloy formulation, to be below the melting point of solder connection 42 or solder ball 40.

Accordingly, by controlling the reflow temperature of the solder particles within solder paste deposit 33, a reliable solder joint 46 or connection may be formed between solder 1 and solder ball 40. As can be seen now, any electrical power provided through power land 18 to PTH via 16 will be conducted through the plated layer 14 into the solder mass 1" to solder ball 40 and thence to electronic module 44 through solder connection 42. Analogously, any signal emanating from or directed to electronic module 44 will be conducted, variously, through solder connection 42, solder ball 40, solder 31" and plated layer 14 of PTH via 17 and thence into signal lands 20 and 22. Signal lands 20 and 22 will convey the signal either to or from some displaced contact elsewhere on the MLPCB 10.

Depending upon the type of flux which is used along with the solder particles in the solder paste deposited onto MLPCB 10, cleaning steps may be required. The cleaning steps for cleaning flux deposits from electronic circuit boards are well known and use conventional materials. The selection of the materials for such cleaning steps are dependent upon the nature of the flux; for example, water may be used if a water soluble flux has been selected for inclusion in the solder paste deposits 30, 33. Cleaning steps would normally be included in the process after each solder paste reflow operation to remove the flux which is no longer needed on the surface of the MLPCB substrate or on the surface of the flanges 12, layers 14 and solder 31, 31"'.

This process lends itself to high volume, mass production because of the accuracies and the efficiencies of screening solder paste into precise, predesignated locations on the surface of MLPCB 10. Large quantities of MLPCB substrates 10 may be screened and then simultaneously reflowed in an oven where accurate temperature control may be maintained to insure the reflow of the solder paste 30 or 33 while maintaining the solid structural integrity of solder connection 42 between electronic component 44 and solder ball 40.

An alternate embodiment of this process may position a solder ball 40 into the solder paste deposit 33 and then position an electronic component 44 with a solder paste deposit at an appropriate location such that the solder paste deposit on the surface of electronic module 44 will align with and engage solder ball 40. If such an embodiment would occur, then the reflowing of solder paste deposit 33 would at the same time reflow the solder paste deposit intermediate solder ball 40 and electronic module 42.

A further alternate embodiment may involve the depositing of flux on the flange 12 and end of PTH vias 16, 17 followed by liberally depositing a solder in particulate form over the entire surface of board 10. Thereafter the solder particles not adhered to the flux may be shaken off the surface and then a reflow operation carried out. The end result would be the same as the process described above.

One of skill in the art will recognize that changes and modifications may be made to the disclosed process without departing from the spirit and the scope of the claims appended hereto.

We claim:

1. A process of attaching an electronic module comprising a plurality of solder balls attached to and extending from said module, to a printed circuit board comprising a plurality of plated through hole vias, comprising the steps of:
   a) depositing a first quantity of solder particles, at an end of at least one of said vias;
   b) reflowing said solder particles;
   c) drawing said reflowed solder into said at least one of said vias;
   d) repeating steps a, b and c until said via is substantially filled with said reflowed solder;
   e) depositing a second quantity of solder paste comprising solder particles;
   f) engaging said solder balls of said electronic module with said solder paste of step e;
   g) forcing said solder balls into said solder paste deposited in step e;
   h) reflowing said solder paste and said reflowed solder.

2. The process of claim 1 wherein said solder particles are incorporated into a solder paste.

3. The process of claim 2 wherein said steps b and h are performed at temperatures sufficient to liquify said solder particles of said solder paste and at a temperature insufficient to liquify said solder balls.

4. The process of claim 2 wherein said steps of depositing solder paste comprises the step of silk screening sand paste onto a plurality of discrete areas on said printed circuit board.

5. The process of claim 2 further comprising a step of cleaning said substrate following step c.

6. The process of claim 2 wherein said process is repeated for mounting electronic modules onto more than one side of said printed circuit board.

7. A process of connecting a first electronic component to a second electronic component comprising steps of:
   a) providing at least one of said components with at least a metal plated through hole via and a surface which said via penetrates;
   b) providing on said surface a region of electrically conductive solder wettable material surrounding said via;
   c) depositing solder paste on said region;
   d) reflowing said solder paste;
   e) drawing said reflowed solder paste into said via;
   f) depositing solder paste on said region;
   g) engaging solder balls with said paste of step f;
   h) repeating step d,
whereby said via is filled with solder and said solder balls are fused to said region by said reflowed solder and a reliable electrical connection is thereby formed.

8. The process of claim 7 further comprising a step of cleaning said at least one of said components to remove flux and manufacturing contaminants.

9. The process of claim 7 wherein said steps d and e are repeated until said via is filled with solder.

10. The process of claim 9 further comprising a step of cleaning said at least one of said components after said step e and any repetition of said step e.

11. A process of connecting an electronic module to an electronic circuit substrate comprising the steps of:
   a) providing a substrate comprising a plurality of electrical circuit lands;
   b) forming an open passage through said substrate and through at least one of said lands, said passage defined by said substrate;
   c) coating said substrate within said passage with an electrically conductive metal, further defining said passage surrounded by said electrically conductive metal;
   d) connecting said land with said coating of electrically conductive metal;
   e) forming a flange of said electrically conductive metal surrounding said passage and disposed on a surface of said substrate;
   f) depositing solder paste comprised of solder particles onto said flange;
   g) heating said substrate and said solder paste to a temperature sufficient to liquify said solder particles;
   h) drawing said solder into said passage;
   i) solidifying said solder;
   j) repeating said steps e and g until said passage is substantially filled with solder;
   k) repeating step f;
   l) providing an electronic component comprising a plurality of solder balls extending therefrom in a pattern alignable with said flanges and solder paste deposited in step k;
   m) aligning said solder balls with said flanges;
   n) forcibly engaging said solder balls with said solder paste on said flanges;
   o) reflowing said solder in said solder paste deposited in step k and said solder within said passage,
whereby said electronic module is electrically connected to at least one of said circuit lands.

* * * * *